(12) United States Patent
Wang et al.

(10) Patent No.: US 11,856,694 B2
(45) Date of Patent: Dec. 26, 2023

(54) CIRCUIT SUBSTRATE AND METHOD FOR MANUFACTURING THE SAME

(71) Applicant: National Taiwan University of Science and Technology, Taipei (TW)

(72) Inventors: Chen-Hao Wang, Taipei (TW); Hsueh-Yu Chen, Taipei (TW); Guan-Cheng Tong, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 731 days.

(21) Appl. No.: 17/008,636

(22) Filed: Aug. 31, 2020

(65) Prior Publication Data

US 2021/0392747 A1 Dec. 16, 2021

(30) Foreign Application Priority Data

Jun. 16, 2020 (TW) .................................. 109120131

(51) Int. Cl.
| | |
|---|---|
| *H05K 1/03* | (2006.01) |
| *H05K 3/18* | (2006.01) |
| *B29C 64/112* | (2017.01) |
| *B33Y 10/00* | (2015.01) |
| *B33Y 80/00* | (2015.01) |

(Continued)

(52) U.S. Cl.
CPC .......... *H05K 1/0353* (2013.01); *B29C 64/112* (2017.08); *B29C 64/30* (2017.08); *B33Y 10/00* (2014.12); *B33Y 40/20* (2020.01); *B33Y 80/00* (2014.12); *C23C 18/1607* (2013.01); *C23C 18/1641* (2013.01); *H05K 3/181* (2013.01); *H05K 3/4644* (2013.01); *B29K 2055/02* (2013.01); *B29K 2067/046* (2013.01); *B29K 2101/12* (2013.01); *B29K 2105/0014* (2013.01);

(Continued)

(58) Field of Classification Search
CPC ........................................ H05K 1/0353–1/0373
See application file for complete search history.

(56) References Cited

U.S. PATENT DOCUMENTS

| | | | |
|---|---|---|---|
| 10,494,721 B1 | 12/2019 | Robinson et al. | |
| 2015/0103494 A1* | 4/2015 | Kim | H05K 3/24 361/728 |
| 2018/0033707 A1* | 2/2018 | Marin | H05K 3/062 |

FOREIGN PATENT DOCUMENTS

| | | |
|---|---|---|
| CN | 104201164 | 12/2014 |
| TW | 201439004 | 10/2014 |
| TW | 201709783 | 3/2017 |

OTHER PUBLICATIONS

"Office Action of Taiwan Counterpart Application", dated Oct. 13, 2020, p. 1-p. 7.

(Continued)

*Primary Examiner* — Jeremy C Norris
(74) *Attorney, Agent, or Firm* — JCIPRNET

(57) ABSTRACT

The disclosure provides a circuit substrate and a method for manufacturing the same. The circuit substrate includes a wiring and a substrate having a base region and a circuit region. The base region having a first pattern is constituted by a first thermoplastic material. The circuit region having a second pattern is constituted by a second thermoplastic material. The first pattern has a portion opposite to the second pattern. The wiring is formed on the circuit region along the second pattern. The first thermoplastic material is different from the second thermoplastic material, and the second thermoplastic material includes a catalyst particle.

8 Claims, 3 Drawing Sheets

(51) Int. Cl.
  *C23C 18/16* (2006.01)
  *B29C 64/30* (2017.01)
  *B33Y 40/20* (2020.01)
  *H05K 3/46* (2006.01)
  *B29K 67/00* (2006.01)
  *B29K 101/12* (2006.01)
  *B29K 105/00* (2006.01)
  *B29L 31/34* (2006.01)
  *B29K 55/02* (2006.01)

(52) U.S. Cl.
  CPC ... *B29L 2031/3425* (2013.01); *H05K 2203/072* (2013.01); *H05K 2203/0736* (2013.01)

(56) References Cited

OTHER PUBLICATIONS

Ji Li et al., "Hybrid Additive Manufacturing Method for Selective Plating of Freeform Circuitry on 3D Printed Plastic Structure," Advanced Materials Technologies, vol. 4, Issue 2, Dec. 4, 2018, pp. 1-10.

Nathan Lazarus et al., "Selective Electroplating for 3D-Printed Electronics," Advanced Materials Technologies, vol. 4, Issue 8, May 20, 2019, pp. 1-5.

\* cited by examiner

CIRCUIT SUBSTRATE AND METHOD FOR MANUFACTURING THE SAME

CROSS-REFERENCE TO RELATED APPLICATION

This application claims the priority benefits of Taiwan application serial no. 109120131, filed on Jun. 16, 2020. The entirety of each of the above-mentioned patent applications is hereby incorporated by reference herein and made a part of this specification.

BACKGROUND OF THE INVENTION

1. Field of the Invention

The disclosure relates to a circuit substrate and a method for manufacturing the same, and in particular to a circuit substrate having a three-dimensional (3D) structure and a method for manufacturing the same.

2. Description of Related Art

A laser-direct-structuring (LDS) is a kind of technique that uses laser to perform a treatment on the surface of a substrate. The LDS can make the treated surface to be selective, so that a wiring pattern can be formed on the treated surface easily. However, a laser treatment requires a lot of energy and time and is limited to a substrate with flat and continuous surfaces. Therefore, how to reduce energy consumption and time and to form a wiring on a substrate with uneven and discontinuous surfaces is one of the problems that researchers in the field are intended to solve urgently.

SUMMARY OF THE INVENTION

The disclosure provides a circuit substrate and a method for manufacturing the same, which can reduce the required energy and time for manufacturing a wiring, and the wiring can be formed on a substrate with uneven and discontinuous surfaces.

The disclosure provides a circuit substrate including a wiring and a substrate having a base region and a circuit region. The base region having a first pattern is constituted by a first thermoplastic material, and the circuit region having a second pattern is constituted by a second thermoplastic material, and the first pattern has a portion opposite to the second pattern. The wiring is formed on the circuit region along the second pattern. The first thermoplastic material is different from the second thermoplastic material, and the second thermoplastic material contains a catalyst particle.

In one embodiment of the disclosure, the content of the catalyst particle is about 0.1 to 10 parts by weight based on 100 parts by weight of the second thermoplastic material.

In one embodiment of the disclosure, the surface roughness of the second pattern is greater than the surface roughness of the first pattern.

In one embodiment of the disclosure, the substrate has a three-dimensional structure formed by a method including a three-dimensional printing method.

In one embodiment of the disclosure, the first thermoplastic material includes a polylactic acid (PLA), and the second thermoplastic material includes an acrylonitrile-butadiene-styrene (ABS).

The disclosure provides a method for manufacturing a circuit substrate. The method includes following steps. A first thermoplastic material is provided. A second thermoplastic material different from the first thermoplastic material is provided, wherein the second thermoplastic material contains a catalyst precursor. The first thermoplastic material and the second thermoplastic material are sprayed to form a substrate having a base region and a circuit region by a three-dimensional printing method, wherein the base region having a first pattern is constituted by the first thermoplastic material, and the circuit region having a second pattern is constituted by the second thermoplastic material, and the first pattern has a portion opposite to the second pattern. The substrate is immersed into a solution containing a reducing agent, so that the catalyst precursor in the second pattern is reduced to a catalyst particle. A wiring is formed on the circuit region along the second pattern.

In one embodiment of the disclosure, the content of the catalyst particle is about 0.1 to 10 parts by weight based on 100 parts by weight of the second thermoplastic material.

In one embodiment of the disclosure, the method for manufacturing the circuit substrate further includes the following step. Before the substrate is immersed into the solution containing the reducing agent, an acid treatment is performed on the substrate, so that the surface roughness of the second pattern is greater than the surface roughness of the first pattern.

In one embodiment of the disclosure, the surface of the second pattern has more hydrophilic groups than the surface of the first pattern after the acid treatment is performed on the substrate.

In one embodiment of the disclosure, the wiring is formed on the circuit region along the second pattern by an electroless plating method.

Based on the above, since the second thermoplastic material contains the catalyst precursor and the substrate having the base region and the circuit region is formed by spraying the first thermoplastic material and the second thermoplastic material, the catalyst precursor can be well distributed in the circuit region having the second pattern. Thereby, the catalyst precursor in the second pattern can be reduced to the catalyst particle as long as the substrate is immersed into the solution containing the reducing agent, and the catalyst particle used as a catalytic agent for forming the wiring can be well distributed in the second pattern. As such, the wiring can be formed on the circuit region along the second pattern no matter the surface of the substrate is flat or continuous, and the required energy and time for manufacturing the wiring can be reduced.

DESCRIPTION OF THE EMBODIMENTS

Figure 1A:
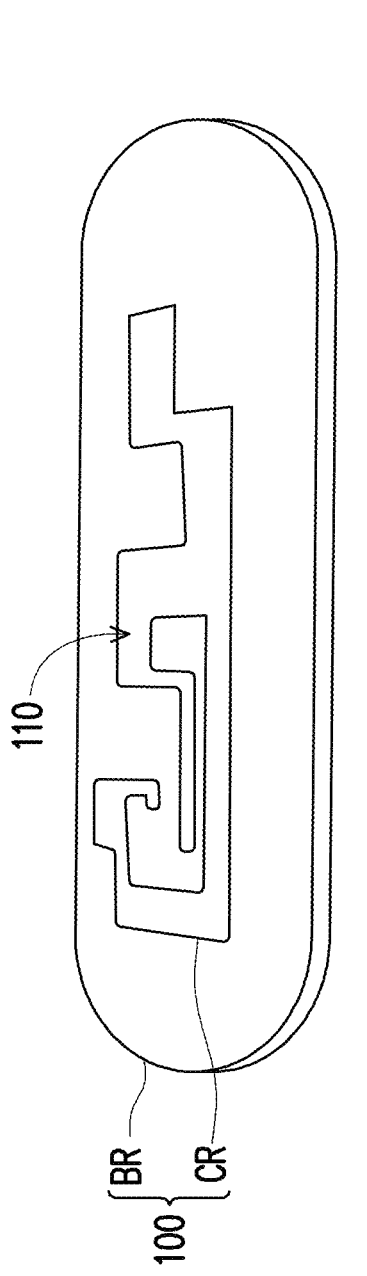
FIG. 1A is a schematic diagram illustrating a substrate according to an embodiment of the disclosure.

The disclosure will be described more comprehensively below with reference to the drawings of the present embodiment. However, the disclosure may be also implemented in various forms, and shall not be limited to the embodiments described herein. For the sake of clarity, thicknesses of layers and regions in the drawings are enlarged. The same or similar reference numbers indicate the same or similar elements, and the following paragraphs will not repeat them one by one. In addition, the directional terms mentioned in the embodiments, such as: up, down, left, right, front, or back, etc. are only directions referring to the accompanying drawings. Therefore, the directional terms used are for the purpose of explaining, but not intended to limit the disclosure.

It will be understood that when an element is, for example, referred to as being "on" or "connected to" another element, it may be directly on or connected to the other element, or there is an intermediate element. When an element is referred to as being "directly on" or "directly connected to" another element, there is no intermediate element.

The terms "about", "approximately" or "substantially" as used herein include values mentioned and average values of specific values capable of being determined by those of ordinary skill in the art within an acceptable deviation range, and measurement discussed and a specific number (i.e., limitation to a measurement system) of measurement-related errors are considered. For example, "about" may be expressed within one or more standard deviations of the value, or within ±30%, ±20%, ±10%, ±5%. Furthermore, the terms "about", "approximately" or "substantially" used herein may select a more acceptable deviation range or standard deviation according to optical properties, etching properties or other properties, and may not to apply one standard deviation to all the properties.

The wording used herein is used only to illustrate exemplary embodiments, but not intended to limit the disclosure. In this case, a singular form includes a plural form unless otherwise explained in the context.

Figure 1B:
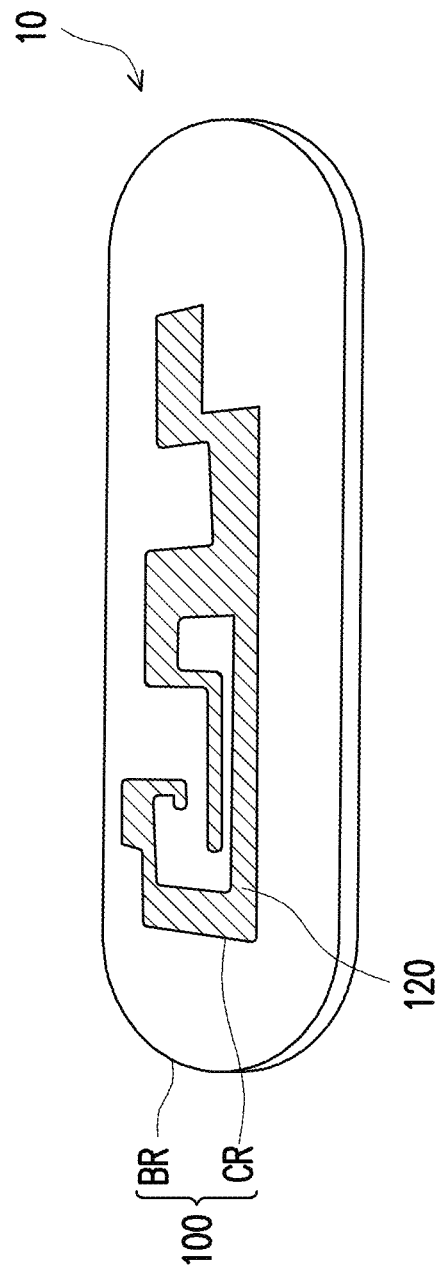
FIG. 1B is a schematic diagram illustrating a circuit substrate according to an embodiment of the disclosure.
Figure 2B:
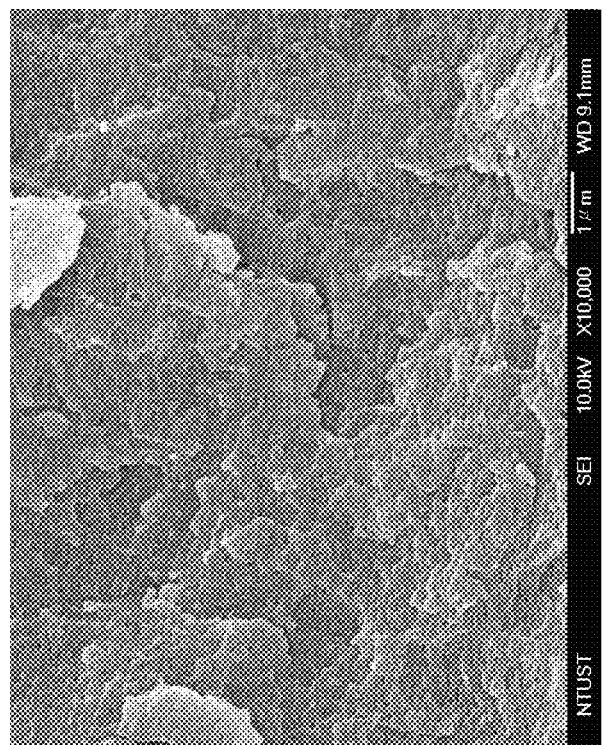
FIG. 2B is a SEM image of the second thermoplastic material after an acid treatment according to an embodiment of the disclosure.
Figure 2A:
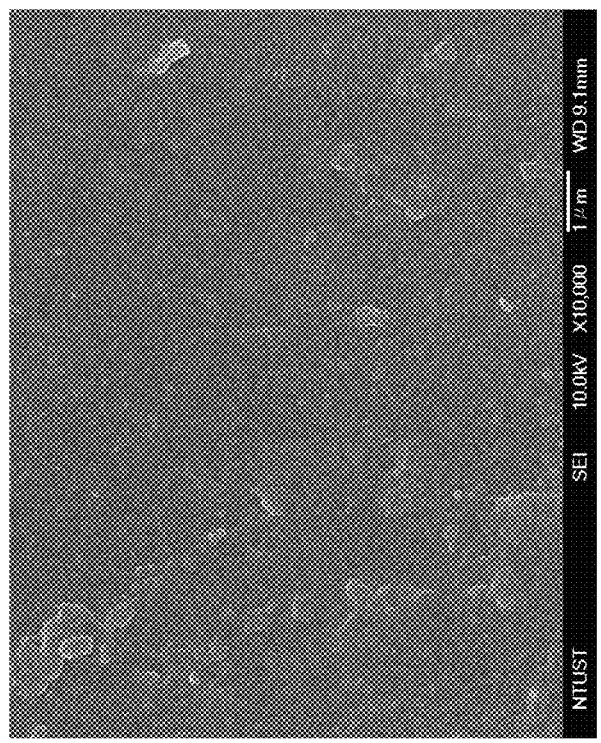
FIG. 2A is a scanning electron microscope (SEM) image of the first thermoplastic material after an acid treatment according to an embodiment of the disclosure.

FIG. 1A is a schematic diagram illustrating a substrate according to an embodiment of the disclosure. FIG. 1B is a schematic diagram illustrating a circuit substrate according to an embodiment of the disclosure. FIG. 2A is a SEM image of the first thermoplastic material after an acid treatment according to an embodiment of the disclosure. FIG. 2B is a SEM image of the second thermoplastic material after an acid treatment according to an embodiment of the disclosure.

Referring to FIG. 1A and FIG. 1B, a circuit substrate 10 may include a substrate 100 and a wiring 120. The substrate may have a base region BR and a circuit region CR, wherein the base region BR constituted by a first thermoplastic material may have a first pattern, and the circuit region CR constituted by a second thermoplastic material may have a second pattern, wherein the first pattern may have a portion opposite to the second pattern. A wiring 120 may be formed on the circuit region CR along the second pattern. In the present embodiment, the first thermoplastic material may be different from the second thermoplastic material, and the second thermoplastic material may include catalyst particles 110. The first thermoplastic material may include a polylactic acid (PLA), and the second thermoplastic material may include an acrylonitrile-butadiene-styrene (ABS). The catalyst particles 110 may include silver nanoparticles. In the present embodiment, the content of the catalyst particles 110 may be about 0.1 to 10 parts by weight based on the 100 parts by weight of the second thermoplastic material.

In the present embodiment, the substrate 100 may be formed by the following steps. (1) Firstly, the first thermoplastic material for forming the base region BR of the substrate 100 is provided. (2) Next, the second thermoplastic material for forming the circuit region CR of the substrate 100 is provided, wherein the second thermoplastic material is different from the first thermoplastic material, and the second thermoplastic material may include a catalyst precursor such as silver nitrate. (3) Then, the first thermoplastic material and the second thermoplastic material are sprayed simultaneously by a three-dimensional printing method to form the substrate 100 having the base region BR and the circuit region CR. That is, the base region BR is constituted by the first thermoplastic material and has the first pattern; and the circuit region CR is constituted by the second thermoplastic material and has the second pattern, and the first pattern has a portion opposite to the second pattern. (4) Then, the substrate 100 is immersed into a solution containing a reducing agent, so that the catalyst precursor in the second pattern can be reduced to catalyst particles 110. (5) After that, the wiring 120 can be formed on the circuit region CR along the second pattern.

In the present embodiment, the second thermoplastic material including the catalyst precursor may be formed by the following steps. Firstly, the second thermoplastic material is mixed with the catalyst precursor. For example, the ABS is mixed with the silver nitrate homogeneously by the mixer. The temperature, rotation speed, and time used in the mixer may be adjusted according to the design, but the invention is not limited thereto. The ABS and the silver nitrate are used as the exemplary examples to describe the invention, but the invention is not limited thereto. Then, after the second thermoplastic material containing the catalyst precursor is shredded and melted, the wire material for the three-dimensional printing can be formed by extruding. In the present embodiment, the content of the catalyst precursor may be about 0.1 to 10 parts by weight based on the 100 parts by weight of the second thermoplastic material. If the content of the catalyst precursor is lower than 0.1 parts by weight, the subsequence formation of wiring 120 cannot be well formed on the circuit region CR along the second pattern, and the wiring pattern of the circuit substrate 10 will be incomplete. If the content of the catalyst precursor is higher than 10 parts by weight, the mechanical property of the circuit substrate 10 will be poor.

In the present embodiment, the solution containing the reducing agent can be selected according to the catalyst precursor. For example, when the catalyst precursor is silver nitrate, a stannous chloride solution can be selected as the solution containing the reducing agent.

In the present embodiment, before immersing the substrate 100 into the solution containing the reducing agent, the substrate 100 is subjected to a acid treatment, so that the surface roughness of the circuit region CR having the second pattern is greater than the surface roughness of the base region BR having the first pattern. For example, if PLA and ABS are used as exemplary embodiments of the first thermoplastic material and the second thermoplastic material, respectively, a sulfuric acid can be used to subject the acid treatment to the substrate 100, such that the surface roughness of the acid-treated ABS is greater than the surface roughness of the acid-treated PLA (as shown in FIG. 2A and FIG. 2B), and the surface of the acid-treated ABS will have more hydrophilic groups than the surface of the acid-treated PLA. As such, when the substrate 100 is immersed into the solution containing the reducing agent subsequently, the differences in the surface roughness and the content of the surface hydrophilic groups of the first thermoplastic material and the second thermoplastic material are able to help the catalyst precursor in the second thermoplastic material to reduce to the catalyst particles and decrease the effect of the solution containing the reducing agent to the first thermoplastic material such as an undesired chemical reaction. Moreover, the differences in the surface roughness and the content of the surface hydrophilic groups of the first thermoplastic material and the second thermoplastic material are able to make the conductive material precisely formed in (or reduced in) the circuit region CR having the second pattern during the subsequent wire formation process, so the overplating phenomenon will not occur. In other words, the substrate 100 can be formed as a plastic substrate with a selective conductive material.

In some embodiments, the solution used in the acid treatment may further include an additive such as manganese dioxide to further enhance the hydrophilicity.

In the present embodiment, the wiring 120 may be formed on the circuit region CR along the second pattern by electroless plating. For example, the substrate 100 may be immersed in an electroless plating solution to selectively reduce the conductive materials such as copper on the circuit region CR of the substrate 100 along the second pattern.

Figure 3B:
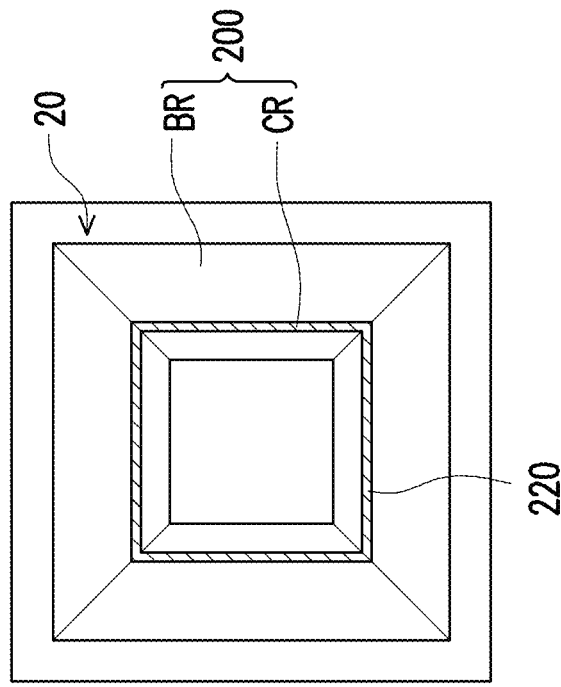
FIG. 3B is a schematic diagram illustrating a circuit substrate according to another embodiment of the disclosure.
Figure 3A:
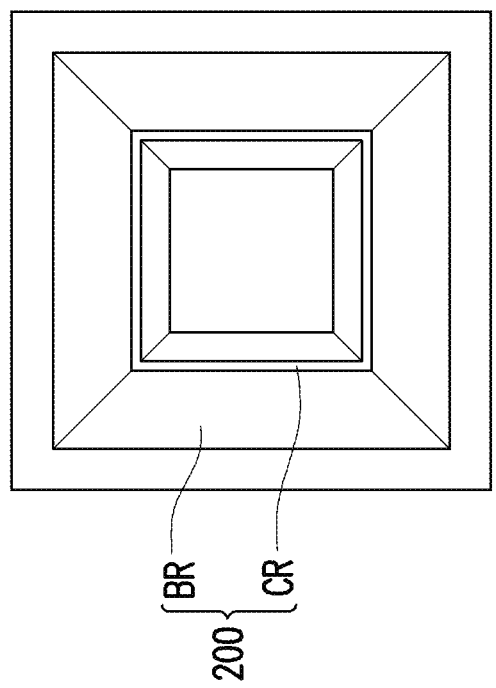
FIG. 3A is a schematic diagram illustrating a substrate according to another embodiment of the disclosure.

FIG. 3A is a schematic diagram illustrating a substrate according to another embodiment of the disclosure. FIG. 3B is a schematic diagram illustrating a circuit substrate according to another embodiment of the disclosure. The substrate 200 shown in FIG. 3A is substantially the same as the substrate 100 shown in FIG. 1A except that the substrate 200 has a three-dimensional structure. The circuit substrate 20 shown in FIG. 3B is substantially the same as the circuit substrate 10 shown in FIG. 1B except that the circuit substrate 20 has a substrate with a three-dimensional structure and the wiring 220 is formed in the inner side of the three-dimensional structure. The connection relationships, materials and manufacturing processes of the remaining components have been described in detail in the foregoing, so the same or similar components use the same or similar reference numerals, and will not be repeated hereafter.

Referring to FIG. 3A and FIG. 3B, in the present embodiment, the substrate 200 having the three-dimensional structure can be formed by three-dimensional printing method, and the users are able to form the circuit region CR at any position in the three-dimensional structure according to their needs. Even if the position is not suitable for performing a surface treatment such as laser (e.g., the container-like inner surface as shown in FIG. 3A), the subsequent process of forming the wiring will not be affected because the circuit region CR of the substrate 200 has good selectivity. As such, the wiring 220 can be well formed on the circuit region CR after a process such as electroless plating is performed, and the problem of over-plating will not occur.

Based on the above, since the second thermoplastic material contains the catalyst precursor and the substrate having the base region and the circuit region is formed by spraying the first thermoplastic material and the second thermoplastic material, the catalyst precursor can be well distributed in the circuit region having the second pattern. Thereby, the catalyst precursor in the second pattern can be reduced to the catalyst particle as long as the substrate is immersed into the solution containing the reducing agent, and the catalyst particle used as a catalytic agent for forming the wiring can be well distributed in the second pattern. As such, the wiring can still be formed on the circuit area along the second pattern well regardless of whether the substrate is a two-dimensional or three-dimensional structure with a complex pattern. That is, the wiring can be formed on the circuit region along the second pattern no matter the surface of the substrate is flat or continuous, and the required energy and time for manufacturing the wiring can be reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A circuit substrate, comprising:
   a substrate having a base region and a circuit region, wherein the base region having a first pattern is constituted by a first thermoplastic material, and the circuit region having a second pattern is constituted by a second thermoplastic material, and the first pattern has a portion opposite to the second pattern; and
   a wiring formed on the circuit region along the second pattern,
   wherein the first thermoplastic material is different from the second thermoplastic material, and the second thermoplastic material contains a catalyst particle,
   wherein the surface roughness of the second pattern is greater than the surface roughness of the first pattern.

2. The circuit substrate according to claim 1, wherein the content of the catalyst particle is about 0.1 to 10 parts by weight based on 100 parts by weight of the second thermoplastic material.

3. The circuit substrate according to claim 1, wherein the substrate has a three-dimensional structure formed by a method comprising a three-dimensional printing method.

4. The circuit substrate according to claim 1, wherein the first thermoplastic material comprises a polylactic acid (PLA), and the second thermoplastic material comprises an acrylonitrile-butadiene-styrene (ABS).

5. A method for manufacturing a circuit substrate, comprising:
   providing a first thermoplastic material;
   providing a second thermoplastic material different from the first thermoplastic material, wherein the second thermoplastic material contains a catalyst precursor;
   spraying the first thermoplastic material and the second thermoplastic material by a three-dimensional printing method to form a substrate having a base region and a circuit region, wherein the base region having a first pattern is constituted by the first thermoplastic material, and the circuit region having a second pattern is constituted by the second thermoplastic material, and the first pattern has a portion opposite to the second pattern;
   immersing the substrate into a solution containing a reducing agent, so that the catalyst precursor in the second pattern is reduced to a catalyst particle; and
   forming a wiring on the circuit region along the second pattern,
   wherein the method further comprises:
   before immersing the substrate into the solution containing the reducing agent, performing an acid treatment on the substrate, so that the surface roughness of the second pattern is greater than the surface roughness of the first pattern.

6. The method for manufacturing the circuit substrate according to claim 5, wherein the content of the catalyst particle is about 0.1 to 10 parts by weight based on 100 parts by weight of the second thermoplastic material.

7. The method for manufacturing the circuit substrate according to claim 5, wherein the surface of the second pattern has more hydrophilic groups than the surface of the first pattern after performing the acid treatment on the substrate.

8. The method for manufacturing the circuit substrate according to claim 5, wherein the wiring is formed on the circuit region along the second pattern by an electroless plating method.

* * * * *